United States Patent
Srinivasan

(10) Patent No.: US 6,534,409 B1
(45) Date of Patent: Mar. 18, 2003

(54) SILICON OXIDE CO-DEPOSITION/ETCHING PROCESS

(75) Inventor: Anand Srinivasan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/138,917

(22) Filed: Aug. 24, 1998

Related U.S. Application Data

(62) Division of application No. 08/760,289, filed on Dec. 4, 1996, now abandoned.

(51) Int. Cl.[7] .................................................. H01L 21/311
(52) U.S. Cl. ..................... 438/696; 438/238; 438/595; 438/695; 438/788
(58) Field of Search ......................... 438/695, 788, 438/696, 639, 238, 265, 267, 624, 595, 787

(56) References Cited

U.S. PATENT DOCUMENTS

| | | | |
|---|---|---|---|
| 4,432,132 A | 2/1984 | Kinsborn ...................... 438/303 |
| 4,690,729 A | 9/1987 | Douglas ....................... 438/695 |
| 4,702,795 A | 10/1987 | Douglas ....................... 438/695 |
| 4,732,761 A | 3/1988 | Machida et al. ............. 438/695 |
| 5,089,442 A | 2/1992 | Olmer ......................... 438/631 |
| 5,110,408 A | 5/1992 | Fujii et al. ..................... 216/75 |
| 5,150,276 A | 9/1992 | Gonzalez et al. ............ 361/313 |
| 5,162,248 A | 11/1992 | Dennison et al. ............ 438/396 |
| 5,223,448 A | 6/1993 | Su ............................... 438/253 |
| 5,236,858 A | 8/1993 | Lee et al. .................... 438/253 |
| 5,264,396 A | 11/1993 | Thakur et al. ............... 438/695 |
| 5,275,977 A | 1/1994 | Otsubo et al. ............... 438/695 |
| 5,278,091 A | 1/1994 | Fazan et al. ................. 438/398 |
| 5,283,204 A | 2/1994 | Rhodes et al. .............. 438/253 |
| 5,302,233 A * | 4/1994 | Kim et al. .................... 156/636 |
| 5,346,585 A * | 9/1994 | Doan et al. .................. 156/643 |
| 5,364,809 A | 11/1994 | Kwon et al. ................. 438/240 |
| 5,407,837 A | 4/1995 | Eklund ......................... 438/151 |
| 5,432,116 A | 7/1995 | Keum et al. ................. 438/397 |
| 5,433,794 A | 7/1995 | Fazan et al. ................ 148/33.3 |
| 5,472,825 A | 12/1995 | Sayka .......................... 430/311 |
| 5,571,571 A | 11/1996 | Musaka et al. ............. 427/574 |
| 5,571,576 A | 11/1996 | Qian et al. ................... 427/574 |
| 5,595,929 A * | 1/1997 | Tseng .......................... 438/397 |
| 5,599,740 A * | 2/1997 | Jang et al. ................... 438/626 |
| 5,858,876 A * | 1/1999 | Chew .......................... 438/695 |
| 5,882,975 A | 3/1999 | Ishikawa ..................... 438/303 |
| 5,915,190 A | 6/1999 | Pirkle ........................... 438/424 |
| 6,274,897 B1 * | 8/2001 | Blalock et al. ............. 257/296 |

* cited by examiner

Primary Examiner—Carl Whitehead, Jr.
Assistant Examiner—Jeff Vockrodt
(74) Attorney, Agent, or Firm—Mueting, Raasch & Gebhardt, P.A.

(57) ABSTRACT

Methods of providing silicon oxide on a substrate in a single process step by simultaneously introducing both a silicon source gas and an etch gas into a CVD chamber. As a result, the method will typically involve simultaneous deposition and etching of the silicon oxide. The method is particularly useful for providing silicon oxide spacers with faceted surfaces.

27 Claims, 2 Drawing Sheets

SILICON OXIDE CO-DEPOSITION/ETCHING PROCESS

This is a division of application Ser. No. 08/760,289, filed Dec. 12, 1999 now abandoned.

FIELD OF THE INVENTION

The present invention relates to the field of semiconductor manufacturing. More particularly, the present invention provides methods of simultaneously depositing and etching silicon oxide on a substrate.

BACKGROUND OF THE INVENTION

Silicon oxide is a useful isolation material used in many semiconductor processes. In one use, silicon oxide can be used as a spacer to provide sloped sidewalls on semiconductor structures with generally vertical sidewalls, such as transistors, trace lines, etc. Because the silicon oxide material has a low dielectric constant, it can also be used to electrically isolate the structures.

Known processes of providing silicon oxide spacers involve a first step of depositing doped or undoped silicon oxide on the semiconductor structures. The silicon oxide can be deposited by a variety of methods including chemical vapor deposition (CVD) and plasma-enhanced chemical vapor deposition (PECVD). Source gases for the silicon oxide layers include silane and tetraethyl orthosilicate (TEOS). Silicon oxide deposited employing PECVD with a TEOS source gas is particularly useful in some instances because the processing temperatures needed for deposition are lower than standard chemical vapor deposition temperatures, i.e., typically about 375° C. Another advantage of PECVD with a TEOS source gas is that it can be used to deposit silicon oxide in between adjacent sidewalls having larger aspect ratios than PECVD or CVD methods using silane as a source gas.

After the layer of silicon oxide is deposited, sloped sidewalls are provided by etching the silicon oxide and/or by reflowing the silicon oxide layer at high temperatures (where those temperatures will not adversely affect any other layers or structures already on the semiconductor wafer). These additional steps of etching and/or reflowing the silicon oxide are performed separately from the step of depositing the silicon oxide, i.e., after the silicon oxide layer has been deposited. As a result, additional time is required for processing—thereby increasing the cost of manufacturing the semiconductor devices on the wafer. In addition, in many instances, the temperatures needed for reflow are not safe to use with the semiconductor wafer.

One particular application in which silicon oxide is used is in the manufacture of stacked capacitor DRAM cells. FIG. 1 is an idealized representation of a stacked capacitor DRAM cell depicting the transistor with a layer of silicon oxide 10 deposited on the top surface 16 and sidewalls 12 in the transistor. This view is idealized in that the actual DRAM cell will not usually have orthogonal features. The initial deposition step in which the silicon oxide 10 is deposited results in a generally uniform layer of oxide over the sidewalls 12, the bottom surface 14 between the sidewalls, and the top surfaces 16 over the electrodes in the transistor. The silicon oxide layer 10 can then be etched using any suitable method to form facets 18 (see FIG. 2) proximate the intersection between the sidewalls 12 and top surfaces 16.

Typically, a number of layers of silicon oxide 10 are deposited and etched until the desired facets 18 are obtained. As a result, the wafer may be subjected to a number of discrete, sequential deposition and etching process steps to obtain the desired faceted or sloped sidewalls needed to ensure complete coverage of the bottom surfaces 14 between sidewalls 12 by both the silicon oxide and later-deposited layers. Those multiple deposition and etching steps add to the cost of the wafers and reduce throughput of the process.

SUMMARY OF THE INVENTION

The present invention provides methods of providing silicon oxide on a substrate in a single process step as opposed to multiple sequential deposition-etch-deposition methods. In addition, if the etch gas contains fluorine, the resulting silicon oxide will also contain fluorine, thereby reducing its dielectric constant which further enhances the insulating properties of the silicon oxide.

The method involves simultaneously introducing both a source gas and an etch gas into a CVD chamber. As a result, the method will typically involve simultaneous deposition and etching of the silicon oxide.

In one aspect according to the present invention, the method includes the steps of depositing silicon oxide on a substrate by contacting the substrate with a plasma enhanced source gas, and contacting the silicon oxide with a plasma enhanced etching gas at the same time as the silicon oxide is deposited.

In another aspect according to the present invention, the method includes forming a silicon oxide spacer on a substrate by depositing silicon oxide on the substrate by contacting the substrate with a plasma enhanced source gas, and contacting the silicon oxide with a plasma enhanced etching gas at the same time as the silicon oxide is deposited.

In another aspect according to the present invention, the method includes forming a silicon oxide spacer on a substrate by providing a substrate in a chamber; providing a plasma enhanced source gas in the chamber, wherein silicon oxide is formed on the substrate; and providing a plasma enhanced etching gas in the chamber at the same time as the source gas is provided in the chamber; wherein a silicon oxide spacer is formed on the substrate.

In another aspect according to the present invention, the method includes depositing a silicon oxide spacer on a DRAM cell by contacting the cell with a plasma enhanced source gas, wherein silicon oxide is formed on the cell, and contacting the silicon oxide with a plasma enhanced etching gas at the same time as the silicon oxide is deposited.

In another aspect according to the present invention, the method includes forming a silicon oxide spacer on a DRAM cell by depositing silicon oxide on the cell by contacting the cell with a plasma enhanced source gas, and contacting the silicon oxide with a plasma enhanced etching gas at the same time as the silicon oxide is deposited.

In another aspect according to the present invention, the method includes forming a silicon oxide spacer on a DRAM cell by providing a DRAM cell in a chamber; providing a plasma enhanced source gas in the chamber, wherein silicon oxide is formed on the DRAM cell; and providing a plasma enhanced etching gas in the chamber at the same time as the source gas is provided in the chamber; wherein a silicon oxide spacer is formed on the DRAM cell.

These and other features and advantages of methods according to the present invention will become more apparent upon reviewing the detailed description of the invention below.

DETAILED DESCRIPTION OF THE INVENTION

The present invention provides a method of depositing silicon oxide by plasma-enhanced chemical vapor deposition on a substrate (typically a semiconductor wafer) which includes providing a plasma enhanced source gas and a plasma enhanced etch gas in the CVD chamber at the same time. The result is that, across the substrate, silicon oxide is being deposited and etched simultaneously in a single process step. Because the deposition and etching occur simultaneously, it is referred to herein as a "co-deposition/etching" process. By describing that the deposition and etching processes occur simultaneously, it should be understood that after some of the silicon oxide is deposited in a given area, a portion of it is removed in the etching process, and then, in the same process step, some additional silicon oxide may be deposited in the same area. The desired result of the co-deposition/etching process according to the present invention is that a contiguous, unbroken layer of silicon oxide is deposited on a substrate. Where the substrate includes generally vertical sidewalls, a sloped or faceted profile can be obtained in the silicon oxide remaining on the semiconductor wafer after processing is complete.

A significant advantage is provided by the methods according to the present invention is that the sloped or faceted sidewall provided by the silicon oxide layer can be produced in a single process step as compared to the multiple, sequential deposition and etching steps typically required to form sloped or faceted sidewalls from silicon oxide deposited by chemical vapor deposition.

Furthermore, the methods of the present invention are particularly well-suited for providing silicon oxide spacers on the surface of a substrate or substrate assembly, referred to herein generally as "substrate," used in forming integrated circuits, such as a silicon wafer, with or without layers or structures formed thereon. It is to be understood that the methods of the present invention are not limited to deposition on silicon wafers; rather, other types of wafers (e.g., gallium arsenide, etc.) can be used as well. Also, the methods of the present invention can be used in connection with silicon-on-insulator technology. In addition, substrates other than semiconductor substrates or substrate assemblies can be used in connection with the present invention. These include, for example, fibers, wires, etc. If the substrate is a semiconductor substrate or substrate assembly, the silicon oxide can be formed directly on the lowest semiconductor surface of the substrate, or they can be formed on any variety of other layers or structures formed on the substrate.

Figure 1:
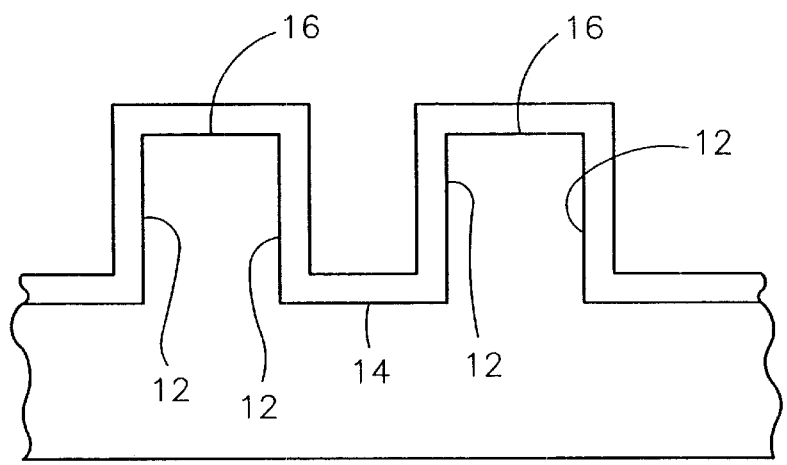
FIG. 1 is a schematic cross-sectional view of one portion of a prior art substrate with a layer of silicon oxide spacer material deposited thereon.
Figure 2:
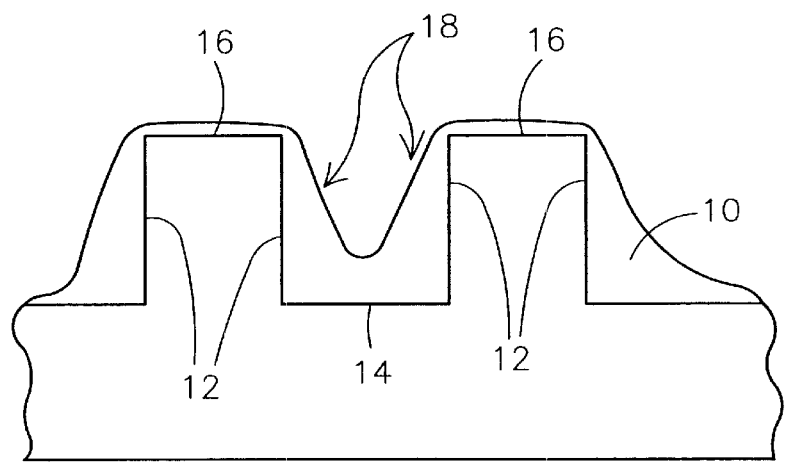
FIG. 2 is a schematic cross-sectional view of a substrate according to FIG. 1 after at least one set of sequential deposition and etching process steps.
Figure 3:
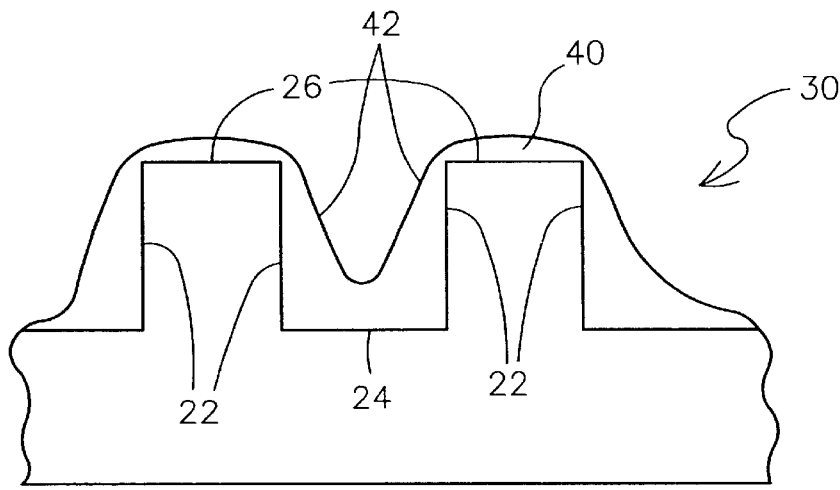
FIG. 3 is a schematic cross-sectional view of a substrate with a silicon oxide layer formed according to the present invention.

One structure 30 on a semiconductor wafer substrate with which the present invention is particularly useful is a stacked capacitor DRAM cell which includes a transistor having a pair of sidewalls 22 as shown in FIG. 3. The sidewalls 22 are separated by a bottom surface 24, typically a drain region. At their upper edges, each of the sidewalls 22 intersects with a top surface 26 over the electrodes in the transistor. The silicon oxide 40 deposited on the structure 30 includes a sloped or faceted surface 42 that is produced by simultaneously etching and depositing the silicon oxide in a plasma enhanced chemical vapor deposition process.

Although a stacked capacitor DRAM cell is one preferred structure for use in the method of the present invention, it will be understood that the method is useful for depositing silicon oxide having a sloped or faceted surface on any structure located on a substrate and having at least one generally vertical sidewall. As used in connection with the present invention, a generally vertical sidewall will be understood as a wall or surface that forms an angle of about 70° to about 110° with the general plane of the substrate.

Figure 4:
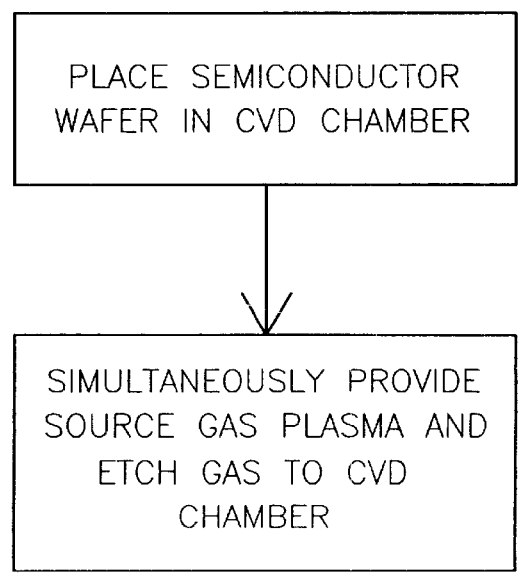
FIG. 4 is a schematic diagram of one plasma-enhanced chemical vapor deposition method according to the present invention.

One method used to obtain the layer of silicon oxide in a single process step is schematically illustrated in FIG. 4. A substrate is placed in a chemical vapor deposition chamber where the temperature of the substrate (and any associated structures) is held at about 400° C. A source gas, preferably tetraethyl orthosilicate (TEOS), is passed through a plasma generator and contacted with the structure on the substrate. At the same time, an etch gas is also passed through a plasma generator and introduced into the chamber where it contacts the silicon oxide being deposited on the substrate. The etch gas and the source gas can be passed through the same plasma generator, although it may be preferable to pass them through separate plasma generators to reduce gas phase reactions between the source and etch gases. The pressure in the chamber can range from about 0.1 Torr to about 50 Torr, more preferably from about 1 Torr to about 10 Torr.

Flow rates of the source and etch gases are related in that a higher flow rate of source gas will typically be paired with a higher flow rate of the corresponding etch gas. This relationship is typically limited at either end by the deposition rate limits under the given process conditions. Typically, however, when TEOS is used as the source gas, its flow rate (when the substrate temperature is about 400° C. and the chamber pressure is between about 1 Torr to about 10 Torr) is preferably between about $1\times10^5$ standard cubic centimeters per minute (sccm) to about $1.5\times10^5$ sccm, more preferably between about $1\times10^5$ sccm to about $0.8\times10^5$ sccm. Under those conditions, the flow rate of a preferred etch gas ($C_2F_6$) is about 5 sccm to about 100 sccm to accomplish the desired co-deposition/etching process according to the present invention.

As a result, the silicon oxide is etched during the deposition process, resulting in faceted or sloped surfaces 42 near to, i.e., proximate, the intersection between the sidewalls 22 and top surfaces 26. One desirable feature of the faceted or sloped surfaces 42 is that their slope is pro-grade as opposed to retro-grade. In other words, the thickness (measured parallel to the general plane of the bottom surface 24) of the silicon oxide layer 40 increases from the top of the sidewall 22 to the bottom of the sidewall 22 near the bottom surface 24. That faceted surface 42 can improve step coverage for later-deposited layers by providing a smoother transition over the features on which the silicon oxide is deposited.

In addition to a faceted or sloped surface 42 in the silicon oxide, the area between the sidewalls 22, i.e., the area above bottom surface 24, is filled with silicon oxide 40 to a higher level than typically seen when sequential deposition and etching steps are used. This phenomenon may also improve step coverage and smooth the surface of the substrate for later-deposited layers.

The source gas preferably includes tetraethyl orthosilicate which is used to form the desired silicon oxide layer. The source gas can include other constituents, e.g., boron, where a doped silicon oxide layer is preferred. Other potential source gases include any suitable gas or combination of gases that can form reactive species in plasma necessary to form silicon oxide layers. Examples include silane, disilane, 1,3,5,7-tetramethylcyclo-tetrasiloxane (TMCTS), etc. In those gas mixtures which do not include an oxygen source (such as silane or disilane) it may be necessary to include pure oxygen or another oxygen-bearing gas as a portion of the source gas to form the silicon oxide layer.

Any etch gas used in connection with the present invention should be selected for its ability to form reactive species in plasma that can react with the silicon oxide being deposited. Another consideration is that the products of the reactions between the reactive species and the silicon oxide are preferably volatile to provide for their removal from the deposition/etching chamber. Preferred etch gases include fluorine-containing gases that are useful in etching silicon oxide, for example, $CF_4$, $C_2F_6$, $C_3F_8$, $CHF_3$, and combinations of one or more of the gases.

An advantage in using a fluorine-containing etch gas is that the silicon oxide layer ultimately deposited on the wafer incorporates fluorine, which has been shown to lead to a reduction in the refractive index of the silicon oxide layer from about 4.1 for pure silicon oxide to about 3.4 for the fluorine-enhanced silicon oxide layer. The reduction in refractive index will generally correlate to a reduction in the dielectric constant of the fluorine-enhanced silicon oxide layer (as compared to the dielectric constant of pure silicon oxide). A lower dielectric constant for the fluorine-enhanced silicon oxide increases the isolating properties of the silicon oxide material.

EXAMPLE

Features and advantages of the methods according to the present invention are further illustrated in the following example. It is recognized, however, that while the example serves this purpose, the particular process conditions, source and etch gases, and structures on which the silicon oxide is deposited, are not to be construed in a manner that would unduly limit the scope of this invention.

A silicon wafer substrate having word lines formed thereon was placed in CVD chamber. The pressure in the chamber was held at about $5 \times 10^{-6}$ Torr and the temperature of the substrate was about 400° C. TEOS was introduced into the chamber at a rate of about 500 Standard Liters per Minute (slm) using a liquid injection system. The etch gas used was $C_2F_6$ and it was introduced into the chamber at the same time as the TEOS, but at a flow rate of 150 sccm. Both the source gas and the etch gas were excited by a plasma generator operating at 450 Watts. The source and etch gases were provided for a period of about 20 seconds.

After the process was complete, a scanning electron microscope was used to examine the resulting oxide spacers which had profiles similar to those depicted in FIG. 3.

Although specific methods and examples have been illustrated and described herein, it will be appreciated by those of ordinary skill in the art that any arrangement that is calculated to achieve the same purpose may be substituted for the specific methods and examples described. This application is intended to cover any adaptations or variations of the present invention. Therefore, it is manifestly intended that this invention be limited only by the claims and the equivalents thereof.

What is claimed is:

1. A method of forming a silicon oxide spacer on a DRAM cell, the method comprising:
   providing a DRAM cell in a chamber;
   providing a plasma enhanced source gas comprising silicon in the chamber by passing a source gas through a first plasma generator, wherein silicon oxide is formed on the DRAM cell;
   providing a plasma enhanced etching gas in the chamber at the same time as the source gas is provided in the chamber, the plasma enhanced etching gas being provided by passing an etching gas through a second plasma generator, wherein a silicon oxide spacer is formed on the DRAM cell; and
   discontinuing formation of the silicon oxide after formation of the silicon oxide spacer.

2. A method according to claim 1, wherein formation of the silicon oxide spacer is discontinued after about 20 seconds.

3. A method of forming a silicon oxide spacer on a DRAM cell, the method comprising:
   providing the DRAM cell in a chamber;
   providing a plasma enhanced source gas comprising silicon in the chamber by passing a source gas through a first plasma generator, wherein silicon oxide is formed on the DRAM cell;
   providing a plasma enhanced etching gas in the chamber at the same time as the source gas is provided in the chamber, the plasma enhanced etching gas being provided by passing an etching gas through a second plasma generator, wherein the silicon oxide spacer is formed as a part of a contiguous, unbroken layer of silicon oxide over the DRAM cell and a surrounding substrate; and
   discontinuing formation of the silicon oxide after formation of the silicon oxide spacer.

4. A method of forming a silicon oxide spacer on a DRAM cell, the method comprising:
   providing the DRAM cell in a chamber;
   providing a plasma enhanced source gas comprising silicon in the chamber by passing a source gas through a first plasma generator, wherein silicon oxide is formed on the DRAM cell;
   providing a plasma enhanced etching gas in the chamber at the same time as the source gas is provided in the chamber, the plasma enhanced etching gas being provided by passing an etching gas through a second plasma generator, wherein the silicon oxide spacer with a varying thickness is formed on the DRAM cell; and
   discontinuing formation of the silicon oxide after formation of the silicon oxide spacer.

5. A method of forming a silicon oxide spacer on a DRAM cell, the method comprising:
   providing the DRAM cell in a chamber;
   providing a plasma enhanced source gas comprising silicon in the chamber by passing a source gas through a first plasma generator, wherein silicon oxide is formed on the DRAM cell,
   providing a plasma enhanced etching gas in the chamber at the same time as the source gas is provided in the chamber, the plasma enhanced etching gas being provided by passing an etching gas through a second plasma generator, wherein the silicon oxide spacer with a varying thickness is formed as a part of a contiguous, unbroken layer of silicon oxide over the DRAM cell and a surrounding substrate; and
   discontinuing formation of the silicon oxide after formation of the silicon oxide spacer.

6. A method of depositing a silicon oxide spacer on a DRAM cell comprising:

contacting the DRAM cell with a plasma enhanced source gas provided by passing a source gas through a first plasma generator, wherein silicon oxide is formed on the DRAM cell; and contacting the silicon oxide with a plasma enhanced etching gas at the same time as the silicon oxide is deposited, the plasma enhanced etching gas provided by passing an etching gas through a second plasma generator, wherein the silicon oxide spacer is formed on the DRAM cell.

7. A method according to claim 6, wherein the DRAM cell comprises a pair of adjacent side surfaces separated by a generally horizontal bottom surface, each side surface connected to a generally horizontal top surface, and further wherein the simultaneous depositing and etching produces a facet in the silicon oxide proximate the intersection of each side surface and respective top surface.

8. A method according to claim 6, wherein the plasma enhanced source gas comprises tetraethyl orthosilicate gas.

9. A method according to claim 6, wherein the plasma enhanced etching gas comprises fluorine.

10. A method according to claim 6, wherein the silicon oxide includes fluorine.

11. A method of forming a silicon oxide spacer on a DRAM cell, the method comprising:

depositing silicon oxide on the DRAM cell by contacting the cell with a plasma enhanced source gas provided by passing a source gas through a first plasma generator; and contacting the silicon oxide with a plasma enhanced etching gas at the same time as the silicon oxide is deposited, the plasma enhanced etching gas provided by passing an etching gas through a second plasma generator, wherein the silicon oxide spacer is formed on the DRAM cell.

12. A method according to claim 11, wherein the plasma enhanced source gas comprises tetraethyl orthosilicate gas.

13. A method according to claim 11, wherein the plasma enhanced etching gas comprises fluorine.

14. A method of forming a silicon oxide spacer on a DRAM cell, the method comprising:

providing the DRAM cell in a chamber;

providing a plasma enhanced source gas in the chamber, the plasma enhanced source gas provided by passing a source gas through a first plasma generator, wherein silicon oxide is formed on the DRAM cell; and providing a plasma enhanced etching gas in the chamber at the same time as the source gas is provided in the chamber, the plasma enhanced etching gas provided by passing an etching gas through a second plasma generator;

wherein the silicon oxide spacer is formed on the DRAM cell.

15. A method according to claim 14, wherein the plasma enhanced source gas comprises tetraethyl orthosilicate gas.

16. A method according to claim 14, wherein the plasma enhanced etching gas comprises fluorine.

17. A method of forming a silicon oxide spacer on a DRAM cell, the method comprising:

depositing silicon oxide on the DRAM cell by contacting the DRAM cell with a plasma enhanced source gas provided by passing a source gas through a first plasma generator;

contacting the silicon oxide with a plasma enhanced etching gas at the same time as the silicon oxide is deposited, the plasma enhanced etching gas provided by passing an etching gas through a second plasma generator, wherein the plasma enhanced etching gas etches the silicon oxide during deposition to produce the silicon oxide spacer on the DRAM cell; and discontinuing the deposition of silicon oxide after formation of the silicon oxide spacer.

18. A method according to claim 17, wherein formation of the silicon oxide spacer is discontinued after about 20 seconds.

19. A method of depositing a silicon oxide spacer on a DRAM cell comprising:

contacting the DRAM cell with a plasma enhanced source gas provided by passing a source gas through a first plasma generator, wherein silicon oxide is formed on the DRAM cell; and contacting the silicon oxide with a plasma enhanced etching gas at the same time as the silicon oxide is deposited, the plasma enhanced etching gas provided by passing an etching gas through a second plasma generator, wherein the silicon oxide spacer is formed as a part of a contiguous, unbroken layer of silicon oxide over the DRAM cell and a surrounding substrate.

20. A method of forming a silicon oxide spacer on a DRAM cell, the method comprising:

depositing silicon oxide on the DRAM cell by contacting the DRAM cell with a plasma enhanced source gas provided by passing a source gas through a first plasma generator;

contacting the silicon oxide with a plasma enhanced etching gas at the same time as the silicon oxide is deposited, the plasma enhanced etching gas provided by passing an etching gas through a second plasma generator, wherein the plasma enhanced etching gas etches the silicon oxide during deposition to produce the silicon oxide spacer as a part of a contiguous, unbroken layer of silicon oxide over the DRAM cell and a surrounding substrate; and discontinuing the deposition of silicon oxide after formation of the silicon oxide spacer.

21. A method of depositing a silicon oxide spacer on a DRAM cell comprising:

contacting the DRAM cell with a plasma enhanced source gas provided by passing a source gas through a first plasma generator, wherein silicon oxide is formed on the DRAM cell; and contacting the silicon oxide with a plasma enhanced etching gas at the same time as the silicon oxide is deposited, the plasma enhanced etching gas provided by passing an etching gas through a second plasma generator, wherein the silicon oxide spacer with a varying thickness is formed on the DRAM cell.

22. A method of forming a silicon oxide spacer on a DRAM cell, the method comprising:

depositing silicon oxide on the DRAM cell by contacting the cell with a plasma enhanced source gas provided by passing a source gas through a first plasma generator; and contacting the silicon oxide with a plasma enhanced etching gas at the same time as the silicon oxide is deposited, the plasma enhanced etching gas provided by passing an etching gas through a second plasma generator, wherein the silicon oxide spacer with a varying thickness is formed on the DRAM cell.

23. A method of forming a silicon oxide spacer on a DRAM cell, the method comprising:

providing the DRAM cell in a chamber;

providing a plasma enhanced source gas in the chamber, the plasma enhanced source gas provided by passing a source gas through a first plasma generator, wherein silicon oxide is formed on the DRAM cell; and providing a plasma enhanced etching gas in the chamber at the same time as the source gas is provided in the chamber, the plasma enhanced etching gas provided by passing an etching gas through a second plasma generator;

wherein the silicon oxide spacer with a varying thickness is formed on the DRAM cell.

24. A method of depositing a silicon oxide spacer on a DRAM cell, comprising:

providing the DRAM cell in a chamber;

providing a source gas comprising plasma enhanced tetraethyl orthosilicate gas in the chamber, the source gas passing through a first plasma generator, wherein silicon oxide is formed on the DRAM cell; and providing a plasma enhanced etching gas comprising fluorine in the chamber at the same time as the source gas is provided in the chamber, the plasma enhanced etching gas provided by passing an etching gas through a second plasma generator;

wherein the silicon oxide spacer with a varying thickness is formed on the DRAM cell, and further wherein the silicon oxide spacer further comprises fluorine.

25. A method of forming a silicon oxide spacer on a DRAM cell, the method comprising:

depositing silicon oxide on the DRAM cell by contacting the DRAM cell with a plasma enhanced source gas provided by passing a source gas through a first plasma generator;

contacting the silicon oxide with a plasma enhanced etching gas at the same time as the silicon oxide is deposited, the plasma enhanced etching gas provided by passing an etching gas through a second plasma generator, wherein the plasma enhanced etching gas etches the silicon oxide during deposition to produce the silicon oxide spacer with a varying thickness on the DRAM cell; and discontinuing the deposition of silicon oxide after formation of the silicon oxide spacer.

26. A method of depositing a silicon oxide spacer on a DRAM cell, the method comprising:

contacting the DRAM cell with a plasma enhanced source gas provided by passing a source gas through a first plasma generator, wherein silicon oxide is formed on the DRAM cell; and contacting the silicon oxide with a plasma enhanced etching gas at the same time as the silicon oxide is deposited, the plasma enhanced etching gas being provided by passing an etching gas through a second plasma generator, wherein the silicon oxide spacer with a varying thickness is formed as a part of a contiguous, unbroken layer of silicon oxide over the DRAM cell and a surrounding substrate.

27. A method of forming a silicon oxide spacer on a DRAM cell, the method comprising:

depositing silicon oxide on the DRAM cell by contacting the DRAM cell with a plasma enhanced source gas provided by passing a source gas through a first plasma generator;

contacting the silicon oxide with a plasma enhanced etching gas at the same time as the silicon oxide is deposited, the plasma enhanced etching gas being provided by passing an etching gas through a second plasma generator, wherein the plasma enhanced etching gas etches the silicon oxide during deposition to produce the silicon oxide spacer with a varying thickness as a part of a contiguous, unbroken layer of silicon oxide over the DRAM cell and a surrounding substrate; and discontinuing the deposition of silicon oxide after formation of the silicon oxide spacer.

* * * * *